United States Patent [19]

Jensen

[11] Patent Number: 4,811,384

[45] Date of Patent: Mar. 7, 1989

[54] METHOD FOR LEVEL REGULATION OF MESSAGE INFORMATION

[75] Inventor: Peter G. Jensen, Malling, Fed. Rep. of Germany

[73] Assignee: Siemens Aktiengesellschaft, Berlin and Munich, Fed. Rep. of Germany

[21] Appl. No.: 832,675

[22] Filed: Feb. 25, 1986

[30] Foreign Application Priority Data

Mar. 1, 1985 [DE] Fed. Rep. of Germany ....... 3507343

[51] Int. Cl.[4] .................... H04B 14/04; H04J 3/04; H04M 3/50
[52] U.S. Cl. ........................................ 379/89; 370/61; 375/25
[58] Field of Search .................. 379/88, 93, 96, 97, 379/98, 89; 375/17, 20, 27; 371/5, 22; 370/61

[56] References Cited

U.S. PATENT DOCUMENTS

| | | | |
|---|---|---|---|
| 4,238,779 | 12/1980 | Dickinson et al. ............... | 371/5 |
| 4,272,845 | 6/1981 | Fiumani ............................ | 375/20 |
| 4,367,456 | 1/1983 | Munter ............................. | 375/98 X |
| 4,439,864 | 3/1984 | Qureshi ............................ | 375/98 |
| 4,499,586 | 2/1985 | Cafarella et al. ................. | 375/98 |
| 4,523,309 | 6/1985 | Piasecki et al. .................. | 370/81 |
| 4,539,692 | 9/1985 | Munter ............................. | 375/98 |
| 4,585,906 | 4/1986 | Matthews et al. ................ | 379/88 |
| 4,619,002 | 10/1986 | Thro ................................. | 375/98 X |
| 4,640,992 | 2/1987 | Rose ................................. | 370/61 X |
| 4,642,630 | 2/1987 | Beckner et al. .................. | 370/61 X |
| 4,679,227 | 7/1987 | Hughes-Hartogs ............... | 379/98 |

Primary Examiner—Thomas W. Brown

[57] ABSTRACT

Voice information are converted into pulse code modulated data sequences which, after a further processing, can likewise be deposited in a memory for a specific subscriber. This subscriber can then fetch the information from the memory at any desired time. Given an attenuation of the analog voice signals on the transmission path, a regulation is undertaken in such a manner, given a downward transgression of a mean voice level, that the digital pulse code modulated data sequence is correspondingly modified in its values thus represented, being modified on the basis of a gain factor which can be read from a table. The drive information for the stored table are supplied by a peak value memory which is, in turn, charged with the output signals of an averaging filter. This method therefore provides that the influence of an attenuation of the analog voice signals existing on the transmission path is significantly limited.

7 Claims, 2 Drawing Sheets

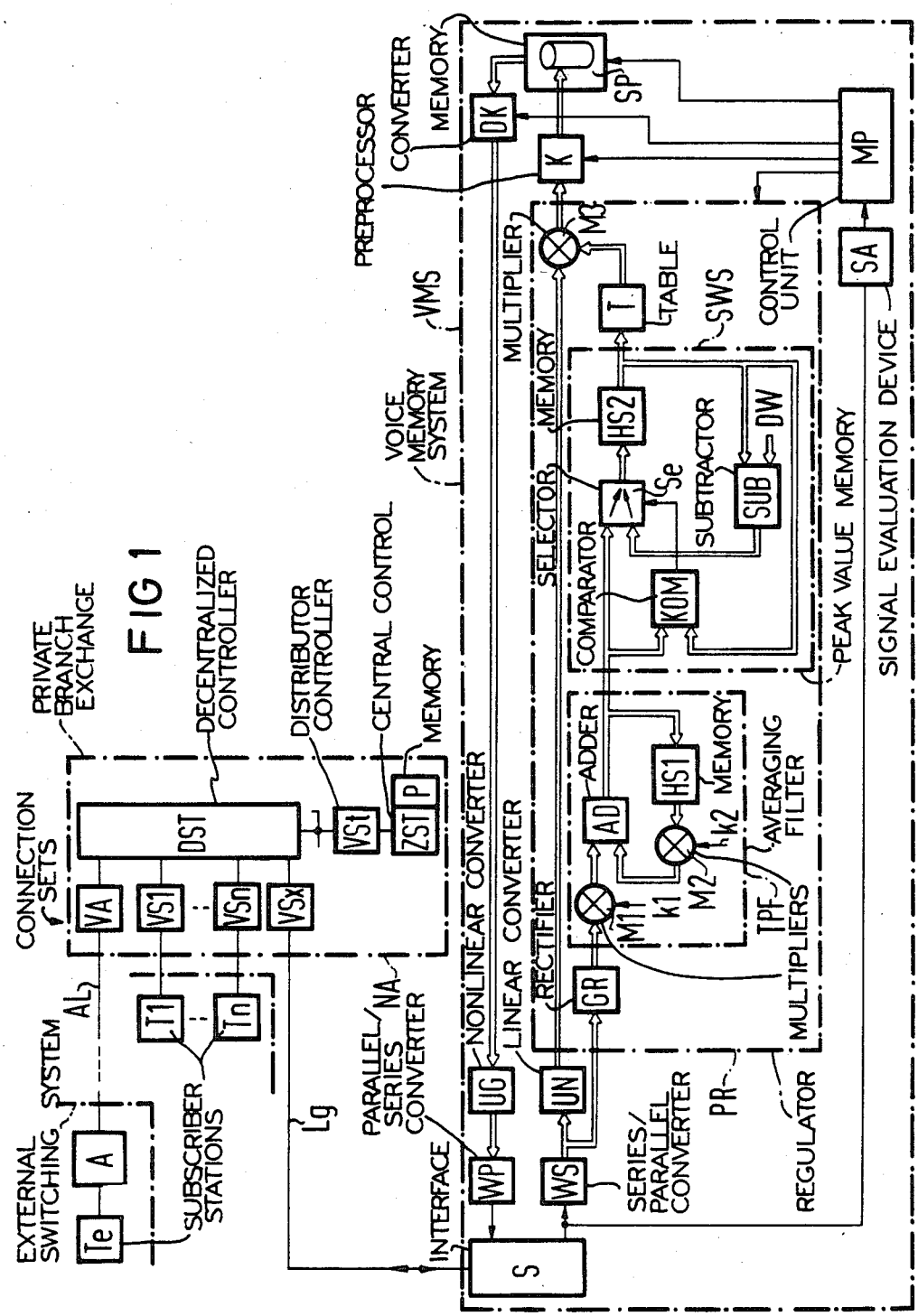

METHOD FOR LEVEL REGULATION OF MESSAGE INFORMATION

BACKGROUND OF THE INVENTION

1. Field of the Invention

The present invention relates to a method for computer-controlled level regulation of message information, particularly of analog voice information transmitted via lines of a telephone switching network, the analog voice information being represented as pulse code modulated data sequences acquired from samples.

2. Description of the Prior Art

Modern computer-controlled switching systems open up a multitude of new possibilities in the use of the telephone. Included herein are, for example, time-offset communication of voice messages which can be respectively deposited in a defined memory region of a central memory arrangement which is permanently assigned to a subscriber. The voice storage and the administrative communication of the individual information can be realized both in the public telephone network and in the private branch exchange systems. That person for whom the voice messages can be deposited in the central memory arrangement can fetch the same at a time which he can freely select. In addition to the recording of the individual messages by the transmitter and the listening by the receiver, it is also possible to edit the messages. For example, when producing the message, the transmitter can erase the message, change it, correct it and the like. For example, the receiver can listen to the message intended for him in parts or repeatedly. The sender has the possibility of interrogating an information as to when and whether his message was delivered. An unauthorized reception of voice communications is prevented, among other things, in that the receiver must prove himself to the system as being an authorized receiver.

When the voice information which has been processed as digital data sequences at the receiving side in the voice memory system after an appropriate conversion is transmitted on the line as analog voice signals, then these can become attenuated on the transmission paths. This could lead to difficulties of comprehension, particularly when the attenuated voice information is called up by an authorized subscriber after it has been stored upon interposition of a transmission line which is likewise attenuated.

SUMMARY OF THE INVENTION

The object of the present invention is to provide a method of the type set forth above and to diminish the influence of attenuation while avoiding the need for generators being inserted into the lines.

The above object is achieved, according to the present invention, in a method which is characterized in that a pulse code modulated data sequence is modified in that the values therewith represented are modified on the basis of control information which defines the amount and the direction of a modification; in that the control information is taken from a stored table which, for this purpose, is in turn driven by a respectively stored peak value of the respective data sequence which is derived from the data sequence; in that the value from the underlying data sequence is taken as the determining, new peak value which directly exceeds the previous peak value in terms of value or exceeds the same in terms of value only after a step-by-step diminution of the value which is then respectively stored, the diminution being undertaken by a prescribed digital value respectively proceeding from the peak value.

The level regulation of the information initially received as analog signals occurs after the digitization of this information. Processing steps which are necessary for an intended, further processing of these digital data sequences can thereby be employed in the regulating process. The control unit which is responsible for a processing, for example, in the form of a microprocessor, can effect the executions necessary for a regulation on the basis of appropriate program steps. Given a connection which allows a high voice level, a value representing this level is retained. When this level is lower during a part of this connection or during a further connection set up by a switching system, then, after a decrementation of the previously-stored value, a new peak value matched to the lower level value is identified. Up to the leveling to a new peak value, accordingly, a specific time interval is claimed in accordance with the invention so that brief, quiet portions of a conversation are thereby retained during a cell connection. Discontinuities in the boosting of the volume are not registratable, in particular, when the value stored in the table and, for example, fixing the necessary amplification relate to the digital data sequences derived from a non-linear characteristic, for example, from a logarithmic characteristic. On the basis of the defined modification values, the digital data sequence formed on the basis of a linear conversion characteristic is employed in order to avoid distortions.

In accordance with a particular feature of the invention, the peak value of the digitized message information is derived from the mean value formation undertaken after the rectification of the digital data sequence. The possibility of noise pulses having an audible effect is thereby prevented by the underlying time constant. In accordance with another feature of the invention, the respectively determining peak value is identified by a comparison of the digital data input sequence to the previous peak value or, respectively, to the value respectively deriving from the step-by-step diminution, being identified in such a manner that the input value is always taken as a new peak value when the comparison occurring in the read clock yields that the input value is greater than the respectively stored value.

In accordance with another feature of the invention, the values for the necessary amplification contained in the stored table can be defined such that an approximately constant digital value is established in a specific attenuation range for the information transmitted. After a further digital processing and another conversion into analog voice signals, a volume necessary for faultless comprehension therefore derives for the analog voice signals.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a simplified block circuit diagram of a private branch exchange which is coupled to a unit for processing and storing information and in which the method of the present invention is applied;

DESCRIPTION OF THE PREFERRED EMBODIMENTS

Figure 2A:
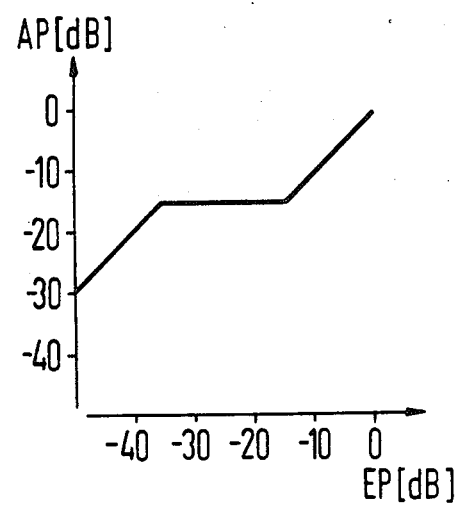
FIG. 2A is a graphic illustration of the output level arising at the output of the multiplier M3 in FIG. 1.

FIG. 1 illustrates, in a greatly simplified block circuit diagram, portions of a private branch exchange NA which, for example, can be a computer-controlled, memory-programmed exchange system. The central control device ZST essentially controls the executions necessary for the individual operating possibilities of the system. It thereby has recourse to corresponding program portions which are stored in a memory P assigned thereto. A distributor controller VST and a decentralized control DST have a specific plurality of devices assigned thereto such as, for example, subscriber stations T1-Tn. Given the assumption of a digital switching system, this decentralized subcontroller DST is, functionally, a computer-controlled memory area into which the digital voice signals are written and read to the respective call partner. It therefore represents a digital switching matrix array. The unit VST is a specific distributor and matching control in order to be able to service a plurality of decentralized subcontrollers DST to which respective sets are coupled.

Therefore, for example, the connection of the subscriber stations T1-Tn occurs via the connection sets VS1-Vsn. The private branch exchange NA is connected to an external system, for example to a switching system A of the public network via an exchange line group or, respectively, via an interexchange link AL. Representing the terminal equipment connected thereto, the subscriber station Te is shown as terminal equipment. The continuing line AL or, respectively, the continuing line group, has a switching set VA assigned thereto. The switching sets or connection sets of the private branch exchange which are shown overall can be fashioned as active sets which contain a processor. This then executes a certain pre-processing of information which, for example, is supplied by the indication locations contained in a subscriber set. It can be provided, for example, that analog terminal equipment are also connected via the correspondingly-fashioned sets in addition to the digital terminal equipment provided in the usual case. Therefore, connections can be switched both via an inter-exchange link AL and via a subscriber line, these connections being based on analog voice information. It is provided that both voice information communicated in digital form and voice information which are communicated as analog voice information are processed in a voice memory system VMS connected to the exchange system NA via a corresponding connection or switching set VSx.

Voice messages which occur for a specific subscriber are stored in a memory device SP. This subscriber then has the possibility of designatingly fetching the message. Both when producing a message and when listening to the message, various operating functions are available to the subscriber. Included among these are, for example, start/stop of the input or output, repetition, forward run/reverse run, erasing, and modifying a message. Such a voice message can also be augmented by further information such as, for example, the identity of the sender, the time of sending, etc.

When messages for a subscriber have arrised in the memory P, then this can be signaled to the subscriber. The existing telephone set can be employed as terminal equipment for a new time-offset type of communication which is enabled by a central voice storage and the administered transmission of the voice messages. The subscriber signals his operating wishes by actuating the cradle contact and the dial. In the reverse direction, he can receive wake-up and dial tones as well as spoken instructions taken from a corresponding memory. In order to lay claim to the individual functions of the voice memory system VMS, therefore, the subscriber who stores a voice message for another subscriber dials specific numbers or numerical combinations. On the basis of this control information, the execution of the respectively assigned function is then initiated. The incoming voice information can be pre-processed in such a manner that they are adjacent as pulse code modulated (PCM) coded signal sequences via a line connection Lg and are forwarded via an interface S.

After analog-to-digital conversion of the incoming, analog voice signals, the corresponding digital signals formed from the samples can first appear as serial signals which, after traversing the interface S after a series-to-parallel conversion in a converter WS, are output in parallel. The connection to the following units occurs via line arrangements which are composed of a plurality of individual lines corresponding in number to the plurality of bits. Such line arrangements are represented in FIG. 1 by the double line parallel trunks.

For further processing, the digital information made available by the converter WS which is formed on the basis of a non-linear, usually logarithmic, characteristic on which the quantization is based, is converted into information derived on the basis of a linear characteristic. This is carried out by the converter UN. As shall be set forth below, the digital data information output by the converter UN is regulated in terms of level in a regulator PR and is supplied to a preprocessor K.

A preprocessing of the incoming information is undertaken in the preprocessor K in order to reduce the memory expense which is necessary for the intended write-in into the memory SP. One possibility of this preprocessing is composed, for example, of converting the PCM signals to what are referred to as ADPCM signals. This preprocessing method by which the digitized voice signal can be stored in companded form is referred to as the adaptive difference pulse code modulation method. This preprocessing, which is known per se, is dependent on control information which is output by the control unit MP, which may be a microprocessor. The control unit MP, which has access to corresponding program memories, controls the executions in the voice memory system VMS.

In addition to the control executions in the regulator PR, the control computer MP controls the step-in and step-out operations of the memory SP. This is also true for the step-in of accompanying information such as, for example, the identity of the subscriber sending the message or the time of sending.

An information flow in which control information is contained, in addition to the voice information, is usually available as input information for the voice processing and memory system VMS. With this control information, a subscriber of the telephone switching system can effect the drive of the voice memory system VMS and edit the voice messages when producing a voice message.

For this purpose, control information is also deposited between the voice information.

The information flow available following the interface S is also supplied to a signal evaluation device SA. This device supplies the control computer MP with information regarding whether control information or voice information appears at a specific time.

When control information is recognized, then the step-in into the memory SP is suppressed by the control signals output by the control computer MP, the step-in into the memory SP being suppressed during the time in which such control information exists. Due to the fact, therefore, that the step-in of control information is suppressed, an undesired disturbance caused by such control information is avoided in the reproduction of the stored information. Such control information is communicated, in particular, as multi-frequency voice (MFV) characters output in accordance with multi-frequency methods.

In the step-out of a message from the memory SP, control information is first communicated from the authorized subscriber. On the basis, for example, of identifier numbers dialed in, the appertaining subscriber can document himself as authorized for the voice memory system VMS or he can signal a desired for repetition of a message. This control information is likewise evaluated by the signal evaluation device SA and leads to corresponding information for the control computer MP.

The converter DK serves the purpose of converting the information contained in companded form in the memory SP into normally coded PCM information after the step-out. Before the information can be transmitted via the interface S to a subscriber, for example, to the subscriber station T1 upon incorporation of the exchange system NA, a conversion of the digital information output in parallel form into serial digital information can also be undertaken. This occurs by way of the parallel-to-series converter WP. Before the information to be stepped out is supplied to this unit, however, a conversion of the digital information formed on the basis of a linear characteristic into the information which is again based on a logarithmic characteristic is undertaken by the nonlinear converter UG.

In addition to being available to the subscribers of a system MA, the voice memory system VMS is also available to external subscribers. However, in a long-distance call, this can be affected with great attenuation. When the voice information communicated via such an attenuated line is stepped in, the message can be difficult to understand when played back. When the telephone connection used for the playback is likewise affected with a high attenuation, this is true to an even greater degree.

In order to assure comprehension during play-back, the regulator PR undertakes a level regulation. To this end, the mean voice level is identified and a differing boost and, under given conditions, a diminution, is effected depending on the magnitude of the existing voice level. In order to avoid distortions, the parallel digital signal sequence is directed into to the linear converter UN and converted therein on the basis of a linear characteristic.

A modification occurs by way of the multiplier M3 which is informed of a multiplication factor required for the modification of the individual digital values, this multiplication factor therefore, for example, defining the amplification to be undertaken. The identification of the multiplication factor occurs given the cooperation of the units GR, TPF, SWS and T.

The digital signal values output in parallel by the converter WS are rectified by the rectifier unit GR. This means that the operational sign bit, where characterizing a positive signal value, remains unaltered, while the operational sign bit, when characterizing a negative signal value, is converted into a bit which corresponds to that of a positive signal value. After the rectification of the operational sign, the information is supplied to an averaging filter TPF which, for example, is constructed as a recursive low-pass filter. In the exemplary embodiment, this known low-pass filter contains an adder AD which emits an averaged value at its output to a peak value memory SWS and which simultaneously supplies the output value to a holding memory HS1 which co-forms it.

After being delayed by a time interval corresponding to a sampling interval of the analog-to-digital conversion, the digital signal supplied by the holding memory HS1 is thereby fed to a multiplier M2. A parameter k2 is supplied to this multiplier. The parameter k2 which, for example, has the value 0.9, serves the purpose of defining what is referred to as the corner frequency of the low-pass filter. The value multiplied by the filter parameter k2 output by the multiplier M2, is supplied to a first input of the adder AD.

In the same manner, a parameter k1 is supplied to the multiplier M1. This parameter is a constant value co-defining the characteristic of the filter. The output of the multiplier M1 is fed to a second input of the adder AD. The multiplier M1 multiplies the digital information output by the rectifier GR by the filter parameter defined by the parameter k1. The value 0.1 can, for example, be prescribed for this filter parameter.

By way of the adder AD, therefore, the signal supplied by the multiplier M1 is added to the signal supplied by the multiplier M2 after the time delay has been undertaken. An averaged value is output at its output as a sum signal. A peak value of the digital information output from the low-pass filter TPF is then identified with the peak value memory SWS.

The digital information supplied by the low-pass filter TPF is compared in a comparator KOM to the digital value of the signal deposited in the holding memory HS2. Whenever this comparison shows that this information is greater in value than the information contained in the holding memory, a selector Se is set by a signal output by the comparator KOM such that the input information supplied by the low-pass filter TPF is transferred into a holding memory HS2. Whenever the comparison undertaken shows that the input information is lessor in value than the information generated by the holding memory HS2, then a signal which is lessor by a specific digital value DW is transferred into the holding memory HS2 to replace the digital value previously contained therein. This is enabled in that the value of the signal currently contained in the holding memory HS2 is supplied to a subtractor SUB which then subtracts the value DW therefrom within one interval of the sampling clock. The selector Se is then set by the comparator KOM such that the value supplied by the subtractor is transferred into the holding memory HS2. The decremented value contained in the holding memory, therefore, always remains in the holding memory during the time interval corresponding to a sampling interval.

The described diminution of rthe value in the holding memory by a decremental value DW is continued until a value which is smaller than the value of the output of the filter TPF is obtained. The value of the output of the filter TPF which is then greater than that obtained by the step-by-step diminution is then transferred into the holding memory HS2 after a working time interval as that peak value determinant for the appertaining call connection. The decay behavior can be influenced by the selection of the respective decremental value which is then prescribed as a fixed value. As a result thereof, the time interval after which a new input value is transferred into the holding memory during the decrementation is normally so great that the call characteristic is retained.

The level of diminution which arises when voice information is briefly spoken more softly during communication does not lead to a level modification in the regulator PR. Such a modification is not undertaken until the voice information level has a low value over a longer time period of, for example, 10 seconds.

Theoretically such a modification in the voice information level can also occur due to the influence of line parameters during an existing connection. Normally, the transfer of a new peak value into the holding memory HS2 necessary due to a lower voice information level is required in a following connection which has a high attenuation. A mean voice information level is then identified in this new connection via the described decrementation logic and the modified value is retained in the holding memory HS2. This value then represents the mean voice level from the appertaining connection.

When a low voice level exists over a longer time interval, it is assumed that an attenuation of the transmission line exists. A boosting of the voice level must therefore be undertaken in such a case. The amount and the direction of a modification in the pending signal to be undertaken is derived from a stored table T. This table is interrogated in view of the value contained in the holding memory HS2 and, as a result of this interrogation, the table T supplies the factor with which the multiplier M3 modifies the pending signal with the existing system clock. The values derivable from the stored table T are defined such that a specific, mean voice level of, for example, −15 dB is achieved ina defined dB range for the input signal at the output of the multiplier M3.

A possibility of modification of the desired voice level can be provided. Another region of the stored table is employed for this purpose. The determining region can be defined by the control unit MP. The signal information appearing at the output of the multiplier M3 is deposited in the memory unit SP via the preprocessor K in the manner already set forth above and can be called in from the preprocessor K.

The control characteristic can be derived from the characteristic illustrated in FIG. 2A which shows the output level AP arising at the output of the multiplier M3 depending on the input level EP. The levels are respectively indicated in dB values and diminish proceeding from the value 0 dB.

Figure 2B:
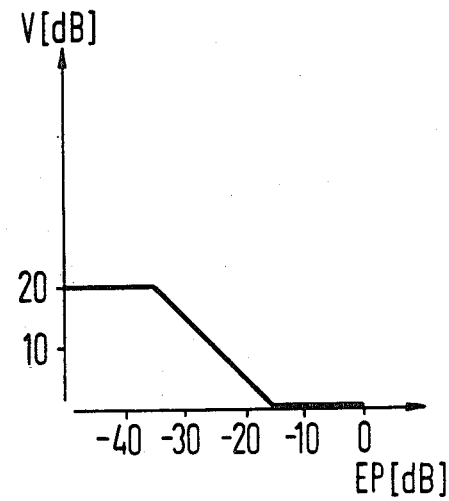
FIG. 2B is a graphic illustration of the gain V dependent on the input level EP.

On the basis of the regulation which has been set forth above, it is achieved in this exemplary embodiment that, in a range from −15 dB through −35 dB for the input level, an approximately constant level of −15 dB derives. Given even smaller input levels, at least one boost is undertaken. In FIG. 2B the gain V is shown dependent on the input level EP. The gain remains at the value 0 dB up to an input level of −15 dB. When the input level decreases, then the gain is boosted in the illustrated manner up to an input level of −35 dB. In the illustrated example, a maximum gain of 20 dB is achieved, this being retained even given a further reduction of the input level.

In the exemplary embodiment of FIG. 1, the information supplied by the series-to-parallel converter WS is employed for the identification of the peak value with a mean voice level. It is also conceivable to supply the rectifier GR and the following units with those digital signals which appear at the output of the multiplier M3. A control characteristic which does not exhibit as an ideal a curve as that in the regulation already set forth derives in this retrieving regulation. A signal which changes less than in the type of regulation set forth above, which should be referred to forward regulation, would then be derived for the derivation of the factor for the multiplier. Those values which can be taken from the stored table on the basis of the values contained in the holding memory HS2 would lie in a different value range given this retrieving regulation.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for level regulation of message information, particularly analog voice information transmitted via lines of a telephone switching network and represented as pulse code modulated digital data sequences acquired from samples, comprising the steps of:
   sequentially receiving the data sequences;
   storing control information which defines amount and direction of modifications of received pulse code modulated data sequences;
   deriving a peak value from each received pulse code modulated data sequence;
   comparing the current peak value with the preceding peak value to determine whether the current peak value is greater than the preceding peak value;
   storing the current peak value as a corresponding digital value when it exceeds the preceding peak value as a determined peak value;
   modifying the current pulse code modulated data sequence with selected control information; and
   storing the modified pulse code modulated data sequence for retrieval.

2. A method for level regulation of message information, particularly analog voice information transmitted via lines of a telephone switching network and represented as pulse code modulated digital data sequences acquired from samples, comprising the steps of:
   sequentially receiving the data sequences;
   storing control information which defines amount and direction of modifications of received pulse code modulated data sequences;
   deriving a peak value from each received pulse code modulated data sequence;
   comparing the current peak value with the preceding peak value to determine whether the current peak value is greater than the preceding peak value;
   storing the current peak value as a corresponding digital value when it exceeds the preceding peak value as a determinate peak value;

modifying the current pulse code modulated data sequence with selected control information;

storing the modified code modulated data sequence for retrieval;

linearly converting the received data sequences when the data sequences have been formed on the basis of a nonlinear conversion characteristic;

and forming the message information on the basis of the nonlinear conversion for the peak value derivation.

3. A method for level regulation of message information, particularly analog voice information transmitted via lines of a telephone switching network and represented as pulse code modulated digital data sequences acquired from samples, comprising the steps of:

sequentially receiving the data sequences;

storing control information which defines amount and direction of modifications of received pulse code modulated data sequences;

deriving a peak value from each received pulse code modulated data sequence;

comparing the current peak value with the preceding peak value to determine whether the current peak value is greater than the preceding peak value;

storing the current peak value as a corresponding digital value when it exceeds the preceding peak value as a determinate peak value;

modifying the current pulse code modulated data sequence with selected control information;

storing the modified code modulated data sequence for retrieval; and diminuting the preceding peak value until the current peak value is greater than the diminuted peak value following the step of comparing the current peak value with the preceding peak value.

4. The method of claim 1, and further comprising the steps of:

defining the modification in a fixed level range of the current pulse code modulated data sequence to provide an approximately constant digital output value; and further processing the digital output value in accordance with a predetermined program.

5. A method for level regulation of message information, particularly analog voice information transmitted via lines of a telephone switching network and represented as pulse code modulated digital data sequences acquired from samples, comprising the steps of:

sequentially receiving the data sequences;

storing control information which defines amount and direction of modifications of received pulse code modulated data sequences;

deriving a peak value from each received pulse code modulated data sequence;

comparing the current peak value with the preceding peak value to determine whether the current peak value is greater than the preceding peak value;

storing the current peak value as a corresponding digital value when it exceeds the preceding peak value as a determinate peak value;

modifying the current pulse code modulated data sequence with selected control information;

storing the modified code modulated data sequence for retrieval; and forming the message information on the basis of a linear conversion for the peak value derivation.

6. A method for level regulation of message information, particularly analog voice information transmitted via lines of a telephone switching network and represented as pulse code modulated digital data sequences acquired from samples, comprising the steps of:

sequentially receiving the data sequences;

storing control information which defines amount and direction of modifications of received pulse code modulated data sequences;

deriving a peak value from each received pulse code modulated data sequence by rectifying each received pulse code modulated sequence;

comparing the current peak value with the preceding peak value to determine whether the current peak value is greater than the preceding peak value;

storing the current peak value as a corresponding digital value when it exceeds the preceding peak value as a determinate peak value;

modifying the current pulse code modulated data sequence with selected control information; and storing the modified code modulated data sequence for retrieval.

7. A method for level regulation of message information, particularly analog voice information transmitted via lines of a telephone switching network and represented as pulse code modulated digital data sequences acquired from samples, comprising the steps of:

sequentially receiving the data sequences;

storing control information which defines amount and direction of modifications of received pulse code modulated data sequences;

deriving a peak value from each received pulse code modulated data sequence;

comparing the current peak value with the preceding peak value to determine whether the current peak value is greater than the preceding peak value;

storing the current peak value as a corresponding digital value when it exceeds the preceding peak value as a determinate peak value;

modifying the current pulse code modulated data sequence with selected control information by multiplying the selected control information with a predetermined multiplication factor; and storing the modified code modulated data sequence for retrieval.

* * * * *